(12) United States Patent
Yabe et al.

(10) Patent No.: US 6,809,002 B2
(45) Date of Patent: Oct. 26, 2004

(54) METHOD OF MANUFACTURING AN ALIGNMENT MARK

(75) Inventors: Sachiko Yabe, Tokyo (JP); Takashi Taguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/154,823

(22) Filed: May 28, 2002

(65) Prior Publication Data

US 2002/0182821 A1 Dec. 5, 2002

(30) Foreign Application Priority Data

May 28, 2001 (JP) ........................................ 2001-159214

(51) Int. Cl.⁷ .............................................. H01L 2/762
(52) U.S. Cl. ...................................... 438/401; 438/975
(58) Field of Search .............................. 438/401, 404, 438/975, FOR 435; 257/792

(56) References Cited

U.S. PATENT DOCUMENTS

| | | | | | |
|---|---|---|---|---|---|
| 5,002,902 A | * | 3/1991 | Watanabe | ................... | 438/401 |
| 5,369,050 A | * | 11/1994 | Kawai | ....................... | 438/401 |
| 5,889,335 A | * | 3/1999 | Kuroi et al. | ................ | 257/797 |
| 6,346,456 B2 | * | 2/2002 | Chen | ........................... | 438/401 |
| 6,368,936 B1 | * | 4/2002 | Yoshida | ...................... | 438/401 |
| 6,368,937 B1 | * | 4/2002 | Nakamura | .................. | 438/401 |
| 6,465,324 B2 | * | 10/2002 | Vogt et al. | .................. | 438/425 |
| 2001/0010380 A1 | * | 8/2001 | Maeda | ....................... | 257/365 |
| 2002/0005594 A1 | * | 1/2002 | Iwamatsu | ................... | 257/797 |
| 2002/0008222 A1 | * | 1/2002 | Maurelli | ..................... | 251/314 |
| 2002/0132458 A1 | * | 9/2002 | Chien et al. | ................ | 438/593 |
| 2002/0140115 A1 | * | 10/2002 | Inoh et al. | .................. | 257/797 |
| 2003/0008472 A1 | * | 1/2003 | Yoshimura et al. | ......... | 438/400 |

FOREIGN PATENT DOCUMENTS

JP          06-021406          1/1994

* cited by examiner

*Primary Examiner*—George Fourson
(74) *Attorney, Agent, or Firm*—Volentine Francos & Whitt, PLLC (57) ABSTRACT

A silicon-on-insulator (SOI) substrate has a grid-line region and a circuit region, and includes a silicon substrate having an upper surface, a first insulating layer having an upper surface and a silicon layer, and which has a grid-line region zoning a circuit region. An element isolation region is formed in the silicon layer of the circuit region of the SOI substrate, and an insulating region is formed in the silicon layer of the grid-line region of the SOI substrate. The insulating region and a portion of the first insulating layer located under the insulating region are removed to define a recess in the grid-line region.

12 Claims, 6 Drawing Sheets

PRIOR ART

METHOD OF MANUFACTURING AN ALIGNMENT MARK

BACKGROUND OF THE INVENTION

1. Field of the Invention

The present invention relates to a method of manufacturing an alignment mark of a semiconductor device, and more particularly, to a method of manufacturing an alignment mark which is used in an alignment between plural layer patterns when a multitiered structure semiconductor device is formed.

The present application claims priority under 35 U.S.C. §119 to Japanese Patent Application No. 2001-159214, filed May 28, 2001, which is herein incorporated by reference in its entirely for all purposes.

2. Description of the Related Art

A conventional method of manufacturing an alignment mark is disclosed in, for example, Japanese Laid-Open Patent Publication: HEI06-021406, published on Jan. 28, 1994.

Figure 7:
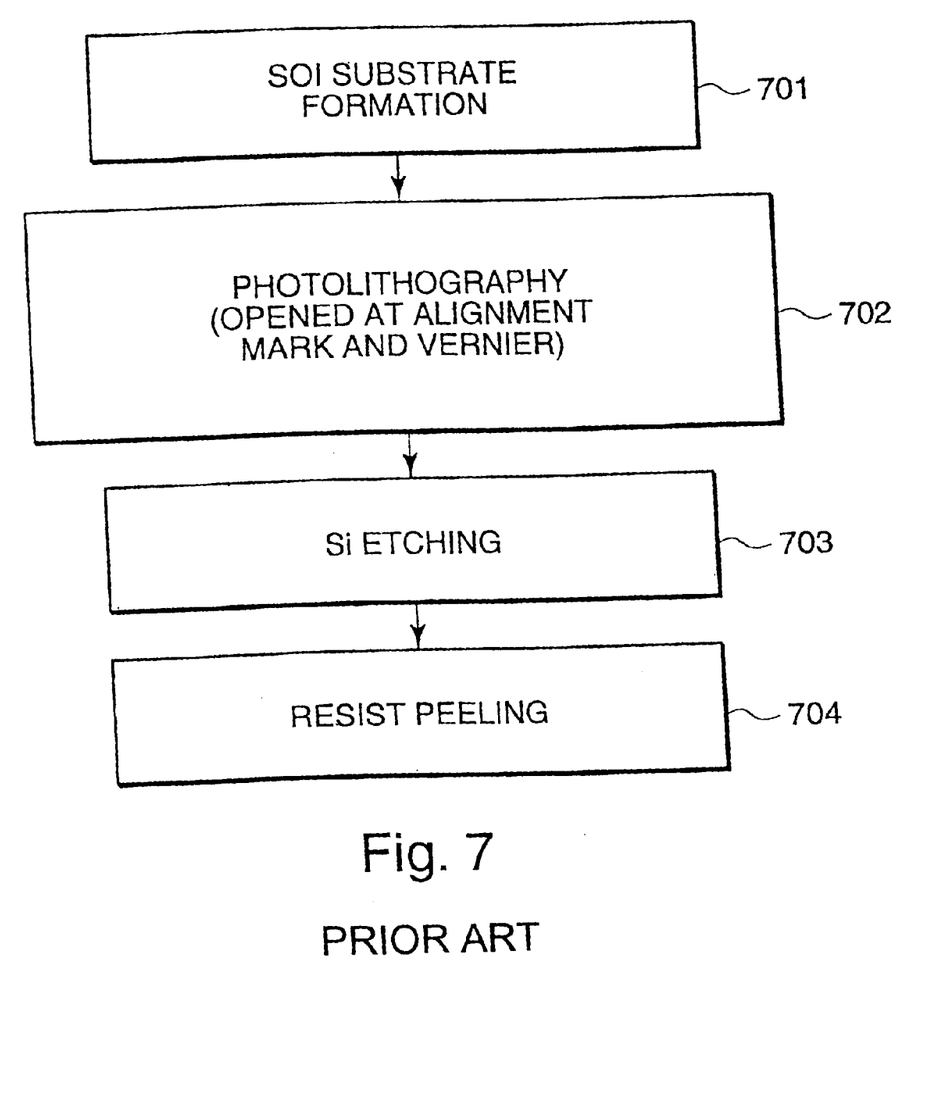
FIG. 7 is a flow chart showing a process sequence according to a conventional method of manufacturing an alignment mark.

FIG. 7 is a flow chart showing a conventional process for manufacturing an alignment mark, in the case of a silicon-on-insulator (SOI) semiconductor structure.

First, as shown in a step 701, an SOI substrate is formed. The representative methods of manufacturing the SOI substrate are bonding technology methods and oxide ion implantation methods. In bonding technology, a silicon wafer having an oxide layer is bonded to another silicon wafer which does not have an oxide film. On the other hand, in oxide ion implantation, an oxide ion is implanted into a silicon wafer, and then a high-temperature thermal treatment is performed.

Next, as shown in step 702, a photolithography using an alignment for an element isolation pattern is performed, and a resist pattern having openings is generated. The openings of the resist pattern are located at alignment mark regions and vernier regions. Next, as shown in a step 703, a silicon etching is performed to remove the SOI layer (the silicon layer) of the SOI wafer at locations of the alignment mark regions and the vernier regions, using a second resist pattern as a mask. Next, as shown in a step 704, a resist peeling is performed to remove the second resist.

Then, a positioning is performed using the alignment mark formed as above, and the positioning is confirmed using the vernier.

More specifically, the following process steps are usually used for an SOI structure wafer (an SOI wafer) having the element isolation pattern.

(1) A forming step of the element isolation pattern. (Isolation regions are formed.)

(2) A forming step of the bond SOI wafer. (Bonding and polishing are performed.)

(3) A forming step of the semiconductor device.

An input into the step (3) after a termination of the step (2) is referred to a line re-input. The SOI layer located at the alignment regions and the vernier regions of the SOI wafer having the element isolation pattern are etched during the line re-input. As a result, sufficient level differences of these regions are ensured. The SOI layer at other regions (e.g. an element formation region) is masked by the resist pattern, and are not etched. Therefore, a photolithography step of aligning the lower element isolation pattern is required. At this time, it is possible to sufficiently detect a signal waveform indicative of the alignment mark for following reasons:

(1) A top layer of the alignment mark and vernier regions is different from that of the element isolation region. The top layer of the alignment mark and vernier regions is consisted of a silicon oxide ($SiO_2$), on the other hand, the top layer of the element isolation region is a silicon (Si).

(2) A range of tolerance with respect to deviation in the alignment is large. At this time, a fine alignment of 0.15 $\mu$m is not required, and about 2.0 $\mu$m is sufficient.

As a result, a clear signal waveform indicative of the alignment mark is obtained. Specifically, since a sufficient level difference of the alignment mark region can be secured, a signal waveform having a sufficient S/N ratio can be obtained.

The alignment mark which is used to the manufacturing process of the semiconductor device having such an SOI structure, is formed by removing the SOI layer of the alignment mark region by etching. However, a thickness of the SOI layer is gradually being reduced to achieve certain technical device advantages (e.g. high integration, high functionality, low power supply voltage, etc.). Therefore, differences in the alignment mark region decrease more and more. As a result, a signal waveform having a sufficient S/N ratio can not be obtained, and it becomes difficult to accurately detect such an alignment mark.

SUMMARY OF THE INVENTION

According to one aspect of the present invention, in a method of manufacturing an alignment mark, a silicon-on-insulator (SOI) substrate is provided having a grid-line region and a circuit region, and including a silicon substrate having an upper surface, a first insulating layer having an upper surface and a silicon layer, an element isolation region is formed in the silicon layer of the circuit region of the SOI substrate, an insulating region is formed in the silicon layer of the grid-line region of the SOI substrate, the insulating region and a portion of the first insulating layer located under the insulating region are removed to define a recess in the grid-line region.

According to the present invention, since the alignment mark is constructed with a deep concave portion, the alignment mark can be detected with a high degree of accuracy in various alignment steps.

The above and further objects and novel features of the invention will more fully appear from the following detailed description, appended claims and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 6(a) through 6(d) are cross-sectional views showing a method of manufacturing an alignment mark according to a third preferred embodiment of the present invention.

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts in order that the present invention will be easily understood.

Figure 1:
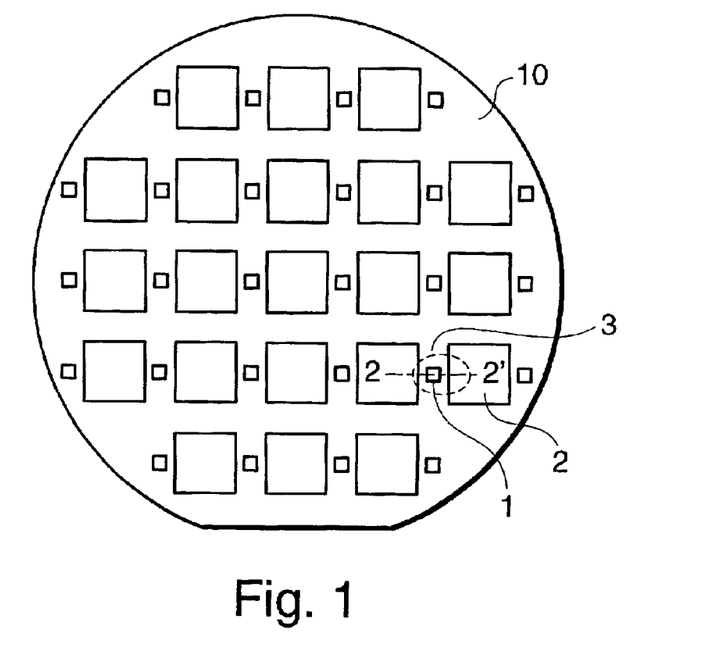
FIG. 1 is a plan view showing a semiconductor wafer which is obtained by a method of manufacturing an alignment mark according to a first preferred embodiment of the present invention.

FIG. 1 is a plan view showing a semiconductor wafer 10 which is obtained by a method of manufacturing an alignment mark 1 according to a first preferred embodiment of the present invention. As shown FIG. 1, the semiconductor wafer 10 having an SOI structure includes the plurality of circuit regions 2, an alignment mark region 3 (the grid-line 3) and the alignment mark 1. The grid-line 3 is located between the plurality of circuit regions 2. The alignment mark M is formed on the grid-line 3. In a semiconductor manufacturing process, the grid-line 3 divides the semiconductor wafer 10 into a plurality of semiconductor chip regions.

Figure 2:
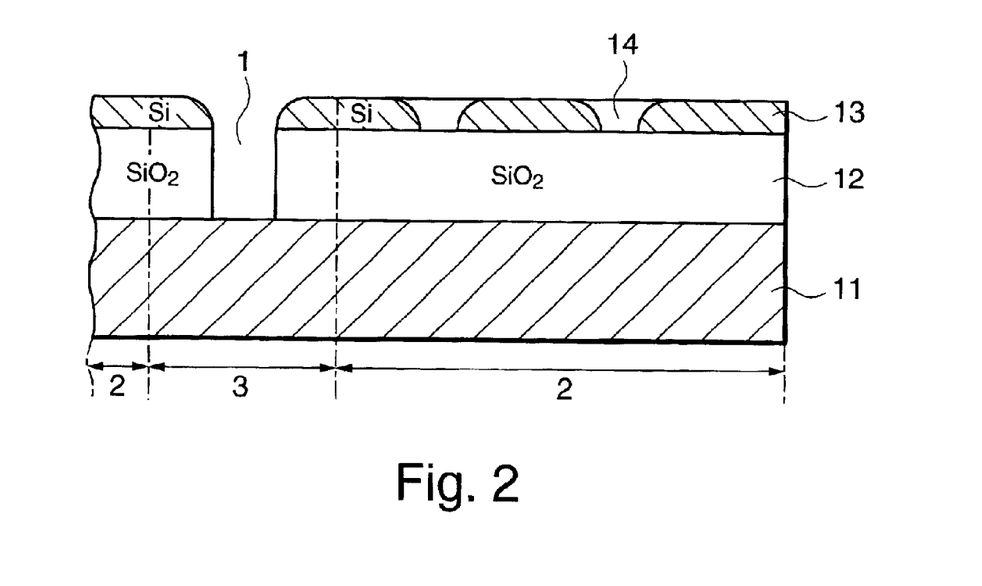
FIG. 2 is a cross-sectional view along the line 2–2' in FIG. 1 of an alignment mark region (a grid-line) between circuit regions.

FIG. 2 is a cross-sectional view along the line 2–2' in FIG. 1 of an alignment mark region 3 (a grid-line 3) between circuit regions 2. As shown in FIG. 2, the semiconductor wafer 10 is constructed with a silicon substrate 11, a silicon oxide layer 12 and a silicon layer 13 (an SOI layer 13). A thickness of the silicon oxide layer 12 is about 120 nm. The SOI layer 13 includes a plurality of element isolation regions 14, and a thickness of the SOI layer 13 and the element isolation regions 14 is about 40 nm. The alignment mark 1 is located at the grid-line 3, and is formed as a concave portion in which the silicon oxide layer 12 and the element isolation layers 14 are removed. At this time, a depth of the alignment mark 1 is about 160 nm, which is equal to the combined thickness of the removed layer 12 and region 14.

A semiconductor device is formed in the circuit region 2 by performing sequentially, for example, a film-forming process, a photolithography process which transcribes and forms a resist pattern indicating a circuit pattern, and an etching process using the resist pattern as a mask.

In the photolithography process, at first, a resist material consisting of a photosensitive polymeric material is coated on the semiconductor wafer. Then, the circuit pattern is exposed by irradiating an ultraviolet rays to the resist material, using a glass mask which has a light blocking pattern consisting of, for example, chromium. In such an exposure process, it is absolutely necessary to align and expose the wafer with a high degree of accuracy. Then, the resist pattern having the circuit pattern is formed by developing the exposed resist material.

Next, the method of manufacturing of the alignment mark according to the first preferred embodiment of the present invention will be described below.

Figure 3A:
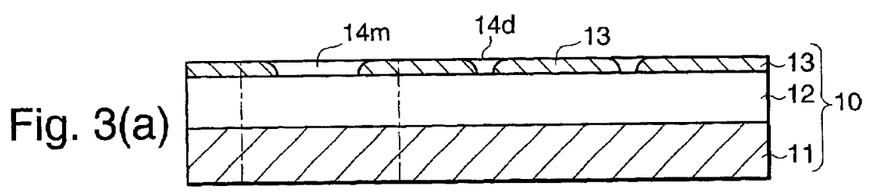
FIGS. 3(a) through 3(e) are cross-sectional views showing a method of manufacturing an alignment mark according to the first preferred embodiment of the present invention.

FIGS. 3(a) through 3(e) and FIGS. 4(a) through 4(d) are cross-sectional views showing a method of manufacturing an alignment mark 1 according to the first preferred embodiment of the present invention. As shown in FIG. 3(a), the silicon oxide layer is formed in the silicon substrate 11 of the semiconductor wafer 10. At this time, a thickness of the silicon oxide layer 12 is, for example, 120 nm, and a thickness of the silicon layer 13 (the SOI layer 13) which is located on the silicon oxide layer 12 is, for example, 40 nm. Then, the element isolation regions 14 of silicon oxide are formed in the silicon layer 13 by a local oxidation of silicon (LOCOS) process. Specifically, an element isolation regions 14d are formed within the circuit region 2, and an element isolation region 14m is formed within the grid-line 3.

Figure 3B:
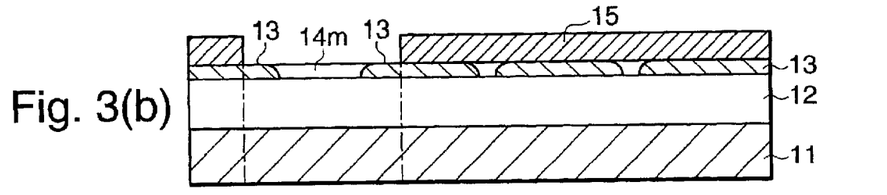

As shown in FIG. 3(b), a resist layer 15 is formed on the SOI layer 13 having the element isolation regions 14. Such a resist layer 15 is obtained by exposing a resist material which is coated on the SOI layer 13 and the element isolation layer 14. The resist layer 15 is formed over the circuit region 2 with an opening over the grid-line 3.

Figure 3C:
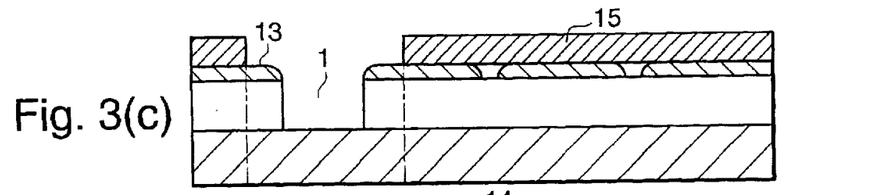

As shown in FIG. 3(c), the element isolation region 14m of the grid-line 3 and the silicon oxide layer located under the element isolation region 14m, are removed by an alternative etching using the resist layer 15 and the SOI layer 13 of the grid-line 3 as a mask. The alternative etching is preformed using a mixed gas including 30 sccm $CHF_3$, 150 sccm Ar and 2 sccm $O_2$, at normal temperatures and under 4 Pa pressure. The term sccm denotes a gas mass flow ($cm^3/m$) per a minute at a normal condition. As a result, the alignment mark 1 is constructed having a concave portion formed in the grid-line 3.

Figure 3D:
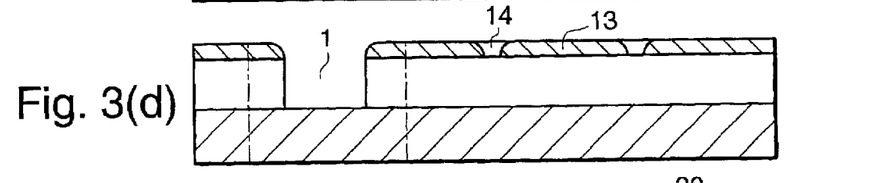

As shown in FIG. 3(d), the resist layer 15 is removed. At this time, a depth of the alignment mark 1 (the concave portion) is about 160 nm.

Figure 3E:
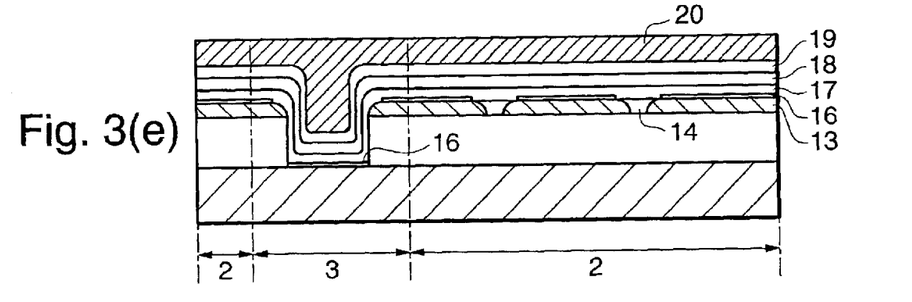

As shown in FIG. 3(e), a poly-silicon layer 17, a tungsten silicide layer 18 and a nitride layer 19 are formed sequentially, after an oxide layer 16 is formed on the SOI layer 13 and the silicon substrate 11 of the grid-line 3. The poly-silicon layer 17 and the tungsten silicide layer 18 are used to form a gate electrode. Then, a resist layer 20 is formed on the nitride layer 19 by coating of a resist material. The resist layer 20 is used in a subsequent photolithography process.

Thereafter, the semiconductor wafer 10 is transported into an exposure apparatus, and then, for example, a halogen light or a laser light is exposed onto a device surface of the semiconductor wafer 10. In the device surface, the above mentioned various layers have been formed at previous process steps. Such an exposed light is reflected and diffracted at boundaries between the various layers, and at a difference of the alignment mark 1. The exposure apparatus detects strength of the refracted light and the diffracted light and outputs an output signal indicating the strength of the light. At this time, the exposure apparatus detects a position of the alignment mark 1 and aligns the semiconductor wafer 10.

Since the alignment mark 1 is constructed with a deep concave portion, a diffused reflection of the alignment mark 1 is larger than that of other regions. Therefore, the alignment mark 1 can be detected with a high degree of accuracy. More further, since the position of the semiconductor wafer 10 is adjusted on the basis of the alignment mark 1, the semiconductor wafer 10 can be correctly aligned.

Next, another example of the first preferred embodiment of the present invention will be described below. FIGS. 4(a) through 4(d) show the another example of the first preferred embodiment of the present invention.

Figure 4A:
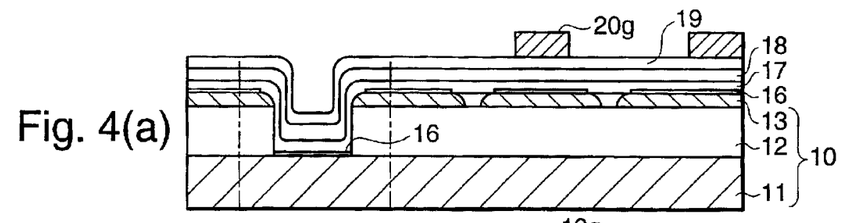
FIGS. 4(a) through 4(d) are cross-sectional views showing a method of manufacturing an alignment mark according to the first preferred embodiment of the present invention.

As shown in FIG. 4(a), a resist pattern 20g which is used to form the gate electrode, is formed at the circuit region 2. Specifically, the resist pattern 20g is formed by subjecting the resist layer 20 to the photolithography process (the exposure and development process).

Figure 4B:
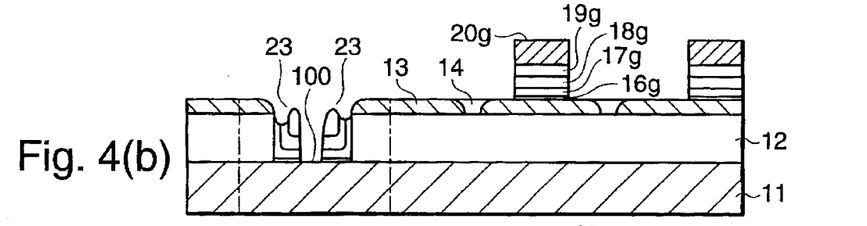

As shown in FIG. 4(b), the nitride layer 19, the tungsten silicide layer 18, the poly-silicon layer 17 and the oxide layer 16 are removed sequentially by an etching process using the resist pattern 20g as a mask. The etching of the nitride layer 19 is performed using a mixed gas including 20 sccm $C_4F_8$, 10 sccm $O_2$ and 400 sccm Ar, at normal temperatures and under 5.3 Pa pressure. The etching of the tungsten silicide layer 18 is performed using a mixed gas 20 sccm $Cl_2$ and 2 sccm $O_2$, at 60° C. temperature and 0.7 Pa pressure. The etching of the poly-silicon layer 17 is performed by using a mixed gas 20 sccm $Cl_2$ and 7 sccm $O_2$, at 60° C. temperature and 0.7 Pa pressure. As a result, the oxide layer 16g, the poly-silicon layer 17g, the tungsten silicide layer 18g and the nitride layer 19g remain under the resist pattern 20g, in the circuit region 2.

On the other hand, in the grid-line 3, since the alignment mark 1 is constructed with a deep concave portion, a side wall 23 including the oxide layer 16, the poly-silicon layer 17, the tungsten silicide layer 18 and the nitride layer 19 is formed on a side surface of the alignment mark 1. As a result, an alignment mark 100 is constructed with a deep concave portion and complex concave and convex portions at a periphery of the deep concave portion. A configuration of the complex concave and convex portions is variable in accordance with a thickness of the above mentioned layers 17, 18 and 19, and the etching conditions.

Figure 4C:
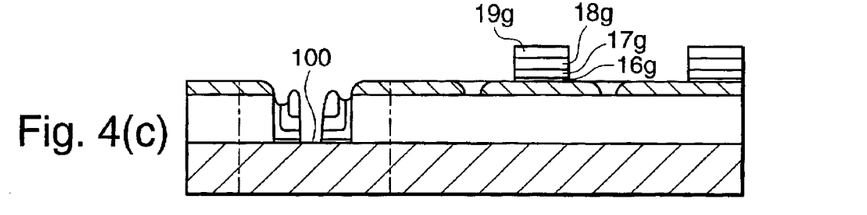

As shown in FIG. 4(c), the gate electrode including the oxide layer 16g, the poly-silicon layer 17g, the tungsten silicide layer 18g and the nitride layer 19g is exposed upon removing the resist pattern 20g.

Figure 4D:
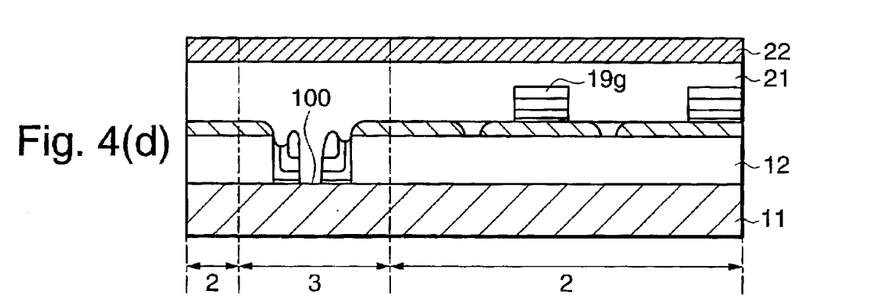

As shown in FIG. 4(d), an interlayer isolating layer 21 is formed on the semiconductor wafer 10. Then, a resist layer 22 is formed on the interlayer isolating layer 21 by coating of a resist material. The resist layer 22 is used in a subsequent photolithography process.

Thereafter, the semiconductor wafer 10 is transported into an exposure apparatus, and then, for example, a halogen light or a laser light is exposed to a device surface of the semiconductor wafer 10. In the device surface, the above mentioned various layers have been formed at previous process steps. Such an exposed light is reflected and diffracted at boundaries between the various layers, and at a difference of the alignment mark 100. The exposure apparatus detects strength of the refracted light and the diffracted light and outputs an output signal indicating the strength of the light. At this time, the exposure apparatus detects a position of the alignment mark 1 and aligns the semiconductor wafer 10.

Since the alignment mark 100 is constructed with a deep concave portion, a diffused reflection of the alignment mark 100 is larger than that of another regions. Therefore, the alignment mark 100 can be detected with a high degree of accuracy. More further, since the position of the semiconductor wafer 10 is adjusted on the basis of the alignment mark 100, the semiconductor wafer 10 can be correctly aligned.

According to the first preferred embodiment of the present invention, since the oxide layer 12 and the element isolating layer 14 which are formed on the silicon substrate 11 are removed by the selective etching, the alignment mark 1 constructed with a deep concave portion can be obtained. Therefore, the alignment mark 1 can be detected with a high degree of accuracy. More further, since the alignment mark 100 can maintain the deep concave portion when the gate electrode is formed, the alignment mark 100 can be detected with a high degree of accuracy in subsequent alignment steps.

Figure 5A:
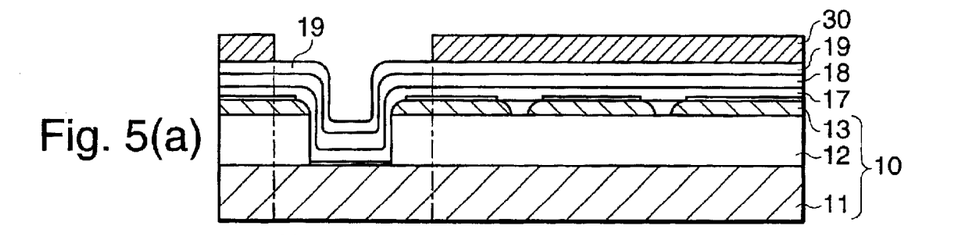
FIGS. 5(a) through 5(e) are cross-sectional views showing a method of manufacturing an alignment mark according to a second preferred embodiment of the present invention.

FIGS. 5(a) through 5(e) are cross-sectional views showing a method of manufacturing an alignment mark according to a second preferred embodiment of the present invention. The second preferred embodiment includes the same process steps as shown in FIGS. 3(a) through 3(e) of the first preferred embodiment. A process step as shown in FIG. 5(a) is performed after a process step as shown in FIG. 3(e).

As shown in FIG. 5(a), a resist pattern 30 covering over the circuit region 2 is formed.

Figure 5B:
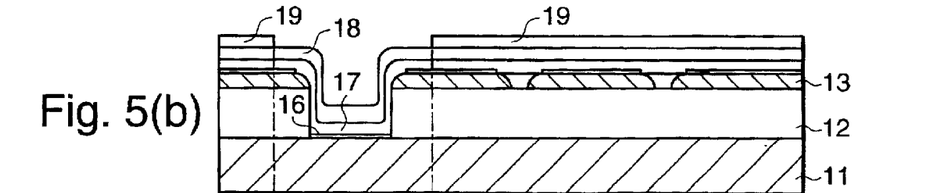

As shown in FIG. 5(b), the nitride layer 19 located at the grid-line 3 is removed by an etching process using the resist pattern 30 as a mask. Therefore, the tungsten silicide layer 18 located at the grid-line 3 is exposed. Then, the resist pattern 30 is removed.

Figure 5C:
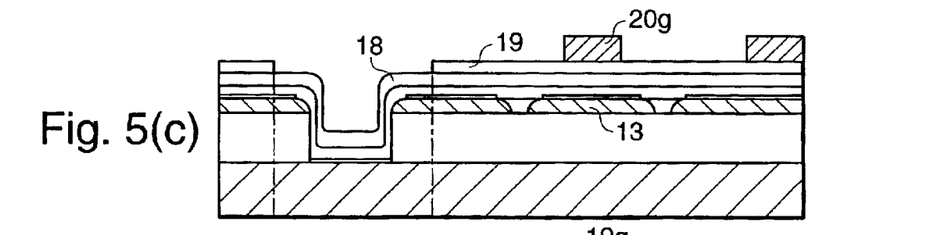

As shown in FIG. 5(c), the resist pattern 20g which is used to form the gate electrode, is formed in the circuit region 2.

Figure 5D:
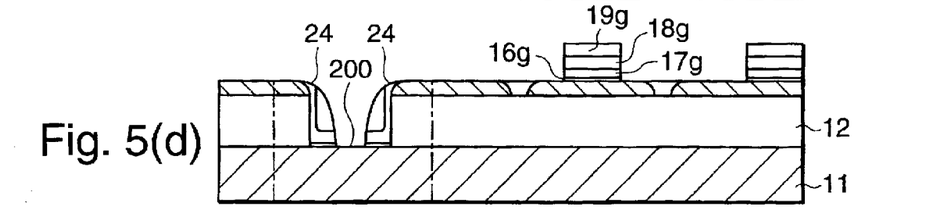

Next, the nitride layer 19, the tungsten silicide layer 18, the poly-silicon layer 17 and the oxide layer 16 are removed sequentially by an etching process using the resist pattern 20g as a mask. On the other hand, in the grid-line 3, since the alignment mark 1 is constructed with a deep concave portion, a side wall 24 including the poly-silicon layer 17 and the tungsten silicide layer 18 is formed on a side surface of the alignment mark 1. Then, the resist pattern 20g is removed. As a result, as shown in FIG. 5(d), the gate electrode is obtained including the gate electrode including the oxide layer 16g, the poly-silicon layer 17g, the tungsten silicide layer 18g and the nitride layer 19g, and an alignment mark 200 is constructed with a deep concave portion, are obtained. Since the side wall 24 does not include the nitride layer 19, a bottom surface of the alignment mark 200 is larger than that of the alignment mark 100 of the first preferred embodiment, and also the concavity of the alignment mark 200 has a greater volume (and is more easily detected) than that of the alignment mark 100.

Figure 5E:
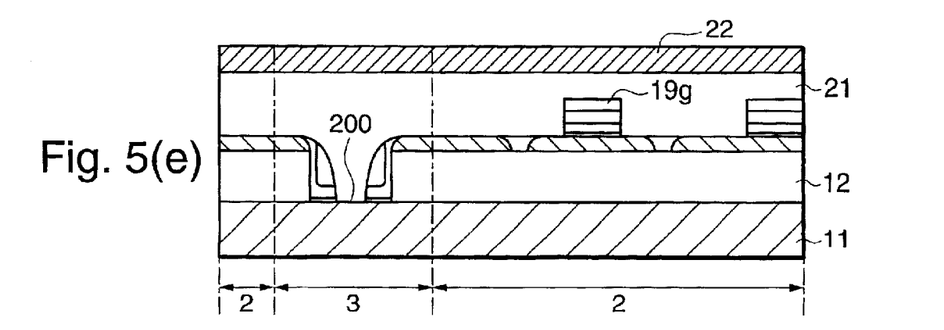

As shown in FIG. 5(e), the interlayer isolating layer 21 is formed on the semiconductor wafer 10. Then, the resist layer 22 is formed on the interlayer isolating layer 21 by coating of a resist material. The resist layer 22 is used in a subsequent photolithography process.

Thereafter, the semiconductor wafer 10 is transported into an exposure apparatus, and then, for example, a halogen light or a laser light is exposed to a device surface of the semiconductor wafer 10. In the device surface, the above mentioned various layers have been formed at previous process steps. Such an exposed light is reflected and diffracted at boundaries between the various layers, and at a difference of the alignment mark 200. The exposure apparatus detects a strength of the refracted light and the diffracted light and outputs an output signal indicating the strength of the light. At this time, the exposure apparatus detects a position of the alignment mark 200 and aligns the semiconductor wafer 10.

Since the alignment mark 200 is constructed with a deep concave portion, a diffused reflection of the alignment mark 200 is larger than that of other regions. Therefore, the alignment mark 200 can be detected with a high degree of accuracy. More further, since the position of the semiconductor wafer 10 is adjusted on the basis of the alignment mark 200, the semiconductor wafer 10 can be correctly aligned.

According to the second preferred embodiment of the present invention, since the nitride layer 19 in the grid-line 3 is removed by the etching process before the gate electrode is formed, the side wall 24 does not include the nitride layer 19. As a result, since a bottom surface of the alignment mark 200 is larger than that of the alignment mark 100 of the first preferred embodiment, and also the concavity of the alignment mark 200 is has a greater volume (and is more easily detected) than that of the alignment mark 100. Therefore, the alignment mark 200 can be detected with a high degree of accuracy in subsequent alignment steps.

Figure 6A:
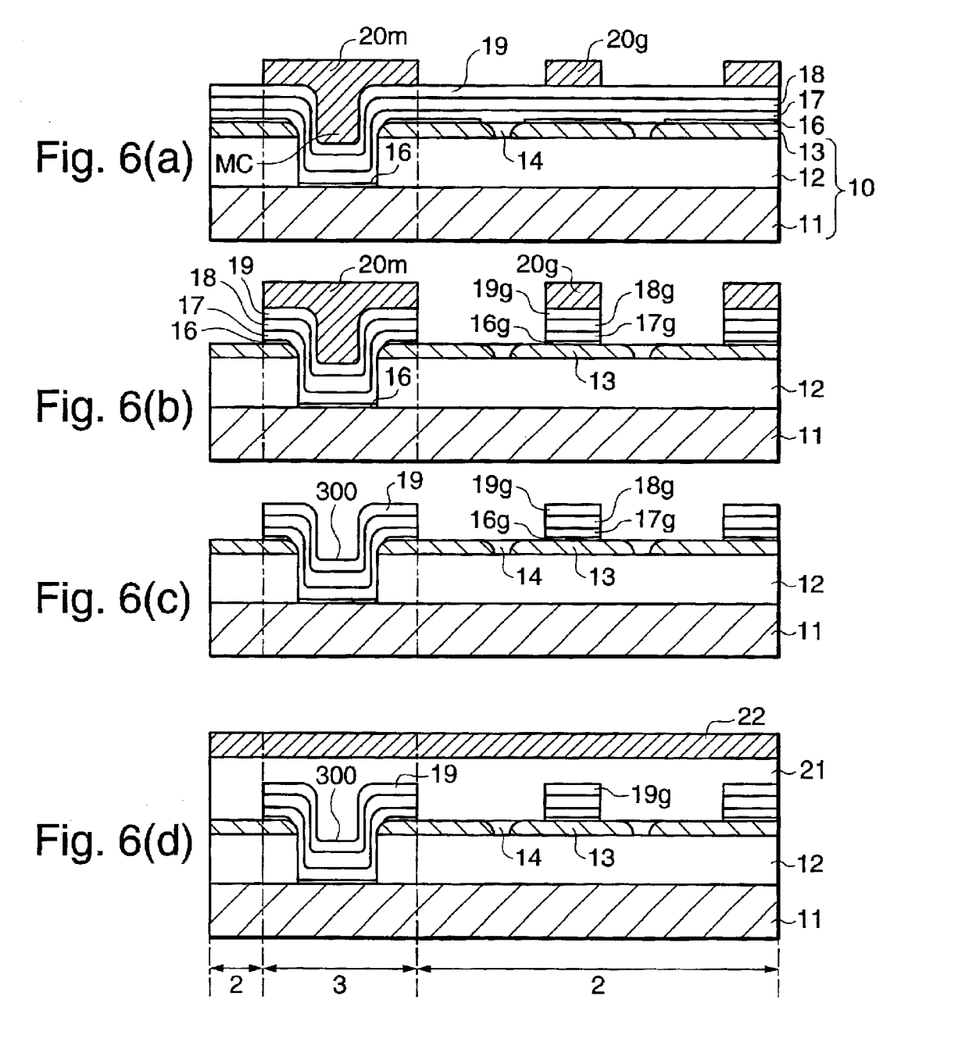

FIGS. 6(a) through 6(d) are cross-sectional views showing a method of manufacturing an alignment mark according to a third preferred embodiment of the present invention. The third preferred embodiment includes the same process steps as shown in FIGS. 3(a) through 3(e) of the first preferred embodiment. A process step as shown in FIG. 6(a) is performed after the process step as shown in FIG. 3(e).

As shown in FIG. 6(a), the resist pattern 20g is formed in the circuit region 2, and a resist pattern 20m is formed in the grid-line 3.

As shown in FIG. 6(b), the nitride layer 19, the tungsten suicide layer 18, the poly-silicon layer 17 and the oxide layer 16 are removed sequentially by an etching process using the resist patterns 20g and 20m as a mask. As a result, the oxide layer 16g, the poly-silicon layer 17g, the tungsten silicide layer 18g and the nitride layer 19g remain under the resist patterns 20g and 20m.

As shown in FIG. 6(c), the resist patterns 20g and 20m are removed. As a result, the gate electrode including the oxide layer 16g, the poly-silicon layer 17g, the tungsten silicide layer 18g and the nitride layer 19g is formed in the circuit region 2. Also, an alignment mark 300 constructed with a deep concave portion which is filled with of the stacked oxide, poly-silicon, tungsten silicide and nitride layers 16, 17, 18 and 19, is formed in the grid-line 3.

As shown in FIG. 6(d), the interlayer isolating layer 21 is formed on the semiconductor wafer 10. Then, the resist layer 22 is formed flatly on the interlayer isolating layer 21 by coating of a resist material. The resist layer 22 is used in a subsequent photolithography process.

Thereafter, the semiconductor wafer 10 is transported into an exposure apparatus, and then, for example, a halogen light or a laser light is exposed to a device surface of the semiconductor wafer 10. In the device surface, the above mentioned various layers have been formed at previous process steps. Such an exposed light is reflected and diffracted at boundaries between the various layers, and at a difference of the alignment mark 300. The exposure apparatus detects a strength of the refracted light and the diffracted light and outputs an output signal indicating the strength of the light. At this time, the exposure apparatus detects a position of the alignment mark 300 and aligns the semiconductor wafer 10.

Since the alignment mark 300 is constructed with a deep concave portion, a diffused reflection of the alignment mark 300 is larger than that of another regions. Therefore, the alignment mark 300 can be detected with a high degree of accuracy. More further, since the position of the semiconductor wafer 10 is adjusted on the basis of the alignment mark 300, the semiconductor wafer 10 can be correctly aligned.

According to the third preferred embodiment of the present invention, since the oxide, poly-silicon, tungsten silicide and nitride layers 16, 17, 18 and 19 remain in the grid-line 3 when the gate electrode is formed, the alignment mark 300 constructed with the deep concave portion can be obtained. Therefore, the alignment mark 300 can be detected with a high degree of accuracy in subsequent alignment steps.

While the present invention presents an example in which the alignment mark is a rectangle as shown in FIG. 1, the invention is not limited to this example and the form of the alignment mark is selectable.

Further, while the present invention presents an example in which the alignment mark constructed with the concave portion (the negative type) is used, the present invention is not limited to this example and an alignment mark constructed a convex portion (a positive type) may be used.

The present invention has been described with reference to illustrative embodiments, however, this invention must not be considered to be confined only to the embodiments illustrated. Various modifications and changes of these illustrative embodiments and the other embodiments of the present invention will become apparent to those skilled in the art with reference to the description of the present invention. It is therefore contemplated that the appended claims will cover any such modifications or embodiments as fall within the true scope of the invention.

What is claimed is:

1. A method of manufacturing an alignment mark, comprising:
   providing a silicon-on-insulator (SOI) substrate having a grid-line region and a circuit region, and including a silicon substrate having an upper surface, a first insulating layer having an upper surface and which is formed on the upper surface of the silicon substrate, and a silicon layer which is formed on the upper surface of the first insulating layer;
   forming an element isolation region in the silicon layer of the circuit region of the SOI substrate;
   forming an insulating region in the silicon layer of the grid-line region of the SOI substrate; and
   removing the insulating region and a portion of the first insulating layer located under the insulating region to define a recess in the grid-line region, by etching using the silicon layer as an etching mask and using the silicon substrate as an etch stopper, wherein the recess exposes the upper surface of the silicon substrate.

2. The method according to claim 1, wherein the element isolation region and the insulating region are formed in a same oxidation process.

3. The method according to claim 1, wherein the insulating region and the portion of the first insulating layer are removed by etching using the silicon layer as a mask.

4. The method according to claim 1, further comprising:
   forming a second insulating layer over an upper surface of the silicon layer and on the upper surface of the silicon substrate within the recess;
   forming a conductive layer over the second insulating layer;
   forming a third insulating layer over the conductive layer;
   forming a first resist pattern over the third insulating layer; and
   removing portions of the second and third insulating layers and the conductive layer, by an etching process using the resist pattern as a mask, to expose the upper surface of the silicon substrate within the recess.

5. The method according to claim 1, further comprising:
   forming a second insulating layer over an upper surface of the silicon layer and on the upper surface of the silicon substrate within the recess;

forming a conductive layer over the second insulating layer;

forming a third insulating layer over the conductive layer;

forming a first resist pattern over the third insulating layer covering over the circuit region;

removing a portion of the third insulating layer located at the grid-line region by an etching process using the first resist pattern as a mask;

exposing a remaining portion of the third insulating layer at the circuit region by removing the first resist pattern;

forming a second resist pattern over the exposed third insulating layer located at the circuit region; and removing the second and third insulating layers and the conductive layer, by an etching process using the second resist pattern as a mask, to expose the upper surface of the silicon substrate within the recess.

6. The method according to claim 1, further comprising:

forming a second insulating layer over an upper surface of the silicon layer and on the upper surface of the silicon substrate within the recess;

forming a conductive layer over the second insulating layer;

forming a third insulating layer over the conductive layer;

forming a first resist pattern over the third insulating layer, the first resist pattern defining circuit patterns in the circuit region and covering the grid-line region; and removing portions of the second and third insulating layers and the conductive layer, by an etching process using the first resist pattern as a mask.

7. A method of manufacturing an alignment mark, comprising:

providing a silicon-on-insulator (SOI) substrate having a grid-line and a circuit region, and including a silicon substrate having an upper surface, a first oxide layer having an upper surface and which is formed over the upper surface of the silicon substrate, and a silicon layer which is formed over the upper surface of the first oxide layer;

forming an element isolation region in the silicon layer of the circuit region of the SOI substrate;

forming an oxide region in the silicon layer of the grid-line region of the SOI substrate; and removing the oxide region and a portion of the first oxide layer located under the oxide region to define a recess in the grid-line region, by etching using the silicon layer as an etching mask and using the silicon substrate as an etch stopper, wherein the recess exposes the upper surface of the silicon substrate.

8. The method according to claim 7, wherein the element isolation region and the oxide region are formed in a same oxidation process.

9. The method according to claim 7, wherein the oxide region and the portion of the first oxide layer are removed by etching using the silicon layer as a mask.

10. The method according to claim 7, further comprising:

forming a first insulating layer over an upper surface of the silicon layer and on the upper surface of the silicon substrate within the recess;

forming a conductive layer over the first insulating layer;

forming a second insulating layer over the conductive layer;

forming a first resist pattern over the second insulating layer; and removing portions of the first and second insulating layers and the conductive layer, by an etching process using the resist pattern as a mask, to expose the upper surface of the silicon substrate within the recess.

11. The method according to claim 7, further comprising:

forming a first insulating layer over an upper surface of the silicon layer and on the upper surface of the silicon substrate within the recess;

forming a conductive layer over the first insulating layer;

forming a second insulating layer over the conductive layer;

forming a first resist pattern over the second insulating layer covering over the circuit region;

removing a portion of the second insulating layer located at the grid-line region by an etching process using the first resist pattern as a mask;

exposing a remaining portion of the second insulating layer at the circuit region by removing the first resist pattern;

forming a second resist pattern over the exposed second insulating layer located at the circuit region; and removing the first and second insulating layers and the conductive layer, by an etching process using the second resist pattern as a mask, to expose the upper surface of the silicon substrate within the recess.

12. The method according to claim 7, further comprising:

forming a first insulating layer over an upper surface of the silicon layer and on the upper surface of the silicon substrate within the recess;

forming a conductive layer over the first insulating layer;

forming a second insulating layer over the conductive layer;

forming a first resist pattern over the second insulating layer, the first resist pattern defining circuit patterns in the circuit region and covering the grid-line region; and removing portions of the first and second insulating layers and the conductive layer, by an etching process using the first resist pattern as a mask.

* * * * *